United States Patent
Kumagai et al.

(10) Patent No.: US 9,966,759 B2
(45) Date of Patent: *May 8, 2018

(54) BATTERY MONITOR CIRCUIT, STORAGE APPARATUS, ELECTRONIC APPARATUS, ELECTRIC-POWERED VEHICLE, AND POWER SYSTEM

(71) Applicant: Sony Corporation, Tokyo (JP)

(72) Inventors: Eiji Kumagai, Kanagawa (JP); Akira Sampei, Fukushima (JP); Kazuharu Yanagihara, Fukushima (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 212 days.

This patent is subject to a terminal disclaimer.

(21) Appl. No.: 14/929,950

(22) Filed: Nov. 2, 2015

(65) Prior Publication Data

US 2016/0072282 A1 Mar. 10, 2016

Related U.S. Application Data

(63) Continuation of application No. 13/529,830, filed on Jun. 21, 2012, now Pat. No. 9,178,366.

(30) Foreign Application Priority Data

Jun. 30, 2011 (JP) .................................. 2011-145140

(51) Int. Cl.
*H02J 1/10* (2006.01)
*H02J 7/00* (2006.01)
(Continued)

(52) U.S. Cl.
CPC .............. *H02J 1/10* (2013.01); *B60L 11/1803* (2013.01); *G01R 31/3658* (2013.01);
(Continued)

(58) Field of Classification Search
CPC . H02J 1/10; H02J 7/0014; H02J 7/007; B60L 11/1803; G01R 31/3658; Y10T 307/685; Y10T 10/7055
(Continued)

(56) References Cited

U.S. PATENT DOCUMENTS 8,907,624 B2* 12/2014 Kumagai .............. H02J 7/0021
320/116
9,178,366 B2* 11/2015 Kumagai .............. H02J 7/0014
(Continued)

FOREIGN PATENT DOCUMENTS

CN 202753802 2/2013

OTHER PUBLICATIONS

Translation of unpublished Japanese Patent Application Serial No. 2011-145140, filed Jun. 30, 2011.
(Continued)

*Primary Examiner* — Ryan Jager
(74) *Attorney, Agent, or Firm* — K&L Gates LLP

(57) ABSTRACT

A battery monitor circuit includes a first monitoring unit for detecting voltages of battery cells in a first group, a second monitoring unit for detecting voltages of battery cells in a second group, and a current cancellation unit for canceling a difference between first and second currents that flow through the first and second monitoring units, respectively. One terminal of a series connection of the battery cells in the first and second groups and one terminal of the first monitoring unit are connected, the other terminal of the first monitoring unit and one terminal of the second monitoring unit are connected, and the other terminal of the second monitoring unit and the other terminal of the series connection are connected. The current cancellation unit is disposed between a connection point between the first and second
(Continued)

monitoring units and a middle connection point in the middle of the series connection.

16 Claims, 10 Drawing Sheets

(51) Int. Cl.
   *B60L 11/18* (2006.01)
   *G01R 31/36* (2006.01)
(52) U.S. Cl.
   CPC ............ *H02J 7/007* (2013.01); *H02J 7/0014* (2013.01); *Y02T 10/7055* (2013.01); *Y10T 307/685* (2015.04)
(58) Field of Classification Search
   USPC ............................................ 320/116; 307/77
   See application file for complete search history.

(56) References Cited

U.S. PATENT DOCUMENTS

| | | | | |
|---|---|---|---|---|
| 9,608,464 | B2* | 3/2017 | Kumagai | ............... H02J 7/0063 |
| 2011/0300415 | A1* | 12/2011 | Kumagai | ............... H02J 7/0021 |
| | | | | 429/7 |
| 2013/0002030 | A1* | 1/2013 | Kumagai | ............... H02J 7/0014 |
| | | | | 307/77 |
| 2013/0009466 | A1* | 1/2013 | Kumagai | ............... H02J 7/0063 |
| | | | | 307/10.1 |
| 2016/0164282 | A1* | 6/2016 | Bellala | .................... H02J 3/383 |
| | | | | 307/52 |
| 2017/0163034 | A1* | 6/2017 | Kumagai | ................... H02J 1/00 |

OTHER PUBLICATIONS

Office Action received in Chinese Application 201210210049.0, dated Aug. 21, 2015 (7 pages).

* cited by examiner

BATTERY MONITOR CIRCUIT, STORAGE APPARATUS, ELECTRONIC APPARATUS, ELECTRIC-POWERED VEHICLE, AND POWER SYSTEM

CROSS REFERENCES TO RELATED APPLICATIONS

The present application is a continuation of U.S. patent application Ser. No. 13/529,830, filed Jun. 21, 2012, which application claims priority to Japanese Priority Patent Application JP 2011-145140 filed in the Japan Patent Office on Jun. 30, 2011, the entire content of which is hereby incorporated by reference.

BACKGROUND

The present disclosure relates to a battery monitor circuit, a storage apparatus, and an electronic apparatus, an electric-powered vehicle, and a power system which use power from the storage apparatus.

The application of secondary batteries such as lithium-ion batteries has rapidly expanded to a power storage apparatus that uses a new energy system such as a solar battery or a wind power generator with a secondary battery and a vehicle storage battery. In a case where many storage elements such as unit batteries (that are also referred to as electric cells or cells and will be hereinafter referred to as battery cells) are used so as to obtain high output power, a structure in which a plurality of storage modules are connected in series is employed. A storage module is formed of battery blocks each including a plurality of battery cells, for example, four battery cells connected in parallel and/or series. Many battery blocks are included in an exterior case, so that a storage module (also referred to as an assembled battery) is formed.

A structure (referred to as a battery system) in which a plurality of storage modules are connected and a common control apparatus is disposed for these storage modules has been proposed. Each of the storage modules includes a processing unit (microprocessor (MPU)), and the MPU and the control apparatus communicate with each other via a communication unit.

In a battery system, it is necessary to monitor the state of charge (SOC) of each battery cell so as to prevent the battery cell from being overcharged or overdischarged. For example, Japanese Unexamined Patent Application Publication No. 2011-030399 discloses the probability that variations in current consumption between management units (integrated circuits) for detecting the voltage of a block (storage module) will cause variations in charging state between blocks.

The number of battery cells (or parallel connections of battery cells, but hereinafter merely referred to as battery cells) in a storage module for which an integrated circuit (hereinafter referred to as a monitor Integrated Circuit (IC)) can perform voltage detection is limited. Accordingly, as illustrated in FIG. 1, a battery monitor circuit 40 including a plurality of monitor ICs (a monitor IC1 and a monitor IC2) is provided in a single storage module.

Referring to FIG. 1, ten battery cells B1 to B10 (for example lithium-ion secondary batteries) are connected in series, and form, for example, a single storage module. In a storage module, battery blocks each obtained by connecting a plurality of battery cells in parallel are used. However, for the simplification of explanation, a case in which only battery cells are used will be described.

The ten battery cells B1 to B10 are classified into two groups, a first group of the battery cells B1 to B5 connected in series and a second group of the battery cells B6 to B10 connected in series. The voltages of the battery cells B1 to B5 in the first group are detected by the monitor IC1 via paths (not illustrated), and the voltages of the battery cells B6 to B10 in the second group are detected by the monitor IC2 via paths (not illustrated). That is, since the maximum number of battery cells that can be monitored by a single monitor IC is limited, two monitor ICs, the monitor IC1 and the monitor IC2, are used.

As a power supply for the monitor IC1 and the monitor IC2, a power supply generated by the series connection of the battery cells B1 to B10 is used. That is, one power terminal (+ side) and the other power terminal (− side) of the monitor IC1 are connected to one terminal (+ side) of the series connection of the battery cells B1 to B10 and the point of connection between the battery cells B5 and B6, respectively. One power terminal (+ side) and the other power terminal (− side) of the monitor IC2 are connected to the point of connection between the battery cells B5 and B6 and the other terminal (− side) of the series connection of the battery cells B1 to B10, respectively. Each monitor IC operates with power supplied from the above-described power supply route, and performs the detection of the voltage of a battery cell and cell balance control. By connecting the point of connection between the battery cells B5 and B6 to a point of connection between the monitor IC1 and the monitor IC2, the potential of the point of connection between the monitor IC1 and the monitor IC2 can be determined

SUMMARY

In a case where a current I1 passing through the monitor IC1 and a current I2 passing through the monitor IC2 are equal, no current flows between the point of connection between power terminals of the monitor IC1 and the monitor IC2 and the point of connection between the battery cells B5 and B6. However, in a case where there is a difference in current consumption between the monitor IC1 and the monitor IC2, the currents I1 and I2 are not equal and a differential current (I1−I2) flows. For example, in a case where the relationship of I1+ΔI=I2 is satisfied, a current I1+ΔI flows through the battery cells B1 to B5 and the current I2 flows through the battery cells B6 to B10.

In a case where there is a difference between discharge currents as described above, the capacity of the battery cells B1 to B5 is reduced more quickly than that of the battery cells B6 to B10. The remaining battery capacity of the battery cells B1 to B5 and the remaining battery capacity of the battery cells B6 to B10 differ from each other. That is, the balance between the group of the battery cells B1 to B5 and the group of the battery cells B6 to B10 is lost. In spite of the fact that a monitor IC is a circuit used to keep the balance between battery cells, the monitor IC becomes the cause of the loss of the balance between battery cells.

Accordingly, it is desirable to provide a battery monitor circuit, a storage apparatus, an electronic apparatus, an electric-powered vehicle, and a power system which are capable of addressing a problem that the difference in current consumption between a plurality of monitor ICs causes the difference in the remaining battery capacity between battery cells and the loss of the balance between battery cells.

According to an embodiment of the present disclosure, there is provided a battery monitor circuit that includes a first monitoring unit configured to detect voltages of battery cells included in a first group, a second monitoring unit configured to detect voltages of battery cells included in a second group, and a current cancellation unit configured to cancel a differential current that is a difference between a first current flowing through the first monitoring unit and a second current flowing through the second monitoring unit. The battery cells included in the first group and the battery cells included in the second group form a series connection. One terminal of the series connection and one power terminal of the first monitoring unit are connected, the other power terminal of the first monitoring unit and one power terminal of the second monitoring unit are connected, and the other power terminal of the second monitoring unit and the other terminal of the series connection are connected. The current cancellation unit is disposed between a connection point between the other power terminal of the first monitoring unit and one power terminal of the second monitoring unit and a middle connection point in the middle of the series connection.

With the above-described configuration, even in a case where there is a difference between the first current flowing through the first monitoring unit and the second current flowing through the second monitoring unit, a current flowing through the battery cells in the first group and a current flowing through the battery cells in the second group can be equal to each other.

A storage apparatus according to an embodiment of the present disclosure includes a series connection of a plurality of battery cells and a battery monitor circuit configured to detect voltages of the plurality of battery cells. The plurality of battery cells in the series connection are classified into at least two groups, a first group and a second group. The battery monitor circuit includes a first monitoring unit configured to detect voltages of battery cells included in the first group, a second monitoring unit configured to detect voltages of battery cells included in the second group, and a current cancellation unit configured to cancel a differential current that is a difference between a first current flowing through the first monitoring unit and a second current flowing through the second monitoring unit. One terminal of the series connection and one power terminal of the first monitoring unit are connected, the other power terminal of the first monitoring unit and one power terminal of the second monitoring unit are connected, and the other power terminal of the second monitoring unit and the other terminal of the series connection are connected. The current cancellation unit is disposed between a connection point between the other power terminal of the first monitoring unit and one power terminal of the second monitoring unit and a middle connection point in the middle of the series connection.

A storage apparatus according to an embodiment of the present disclosure includes the above-described storage apparatus. Power is supplied to an electronic apparatus connected to the above-described storage apparatus.

An electronic apparatus according to an embodiment of the present disclosure receives power from the above-described storage apparatus.

An electric-powered vehicle according to an embodiment of the present disclosure includes a conversion apparatus configured to receive power from the above-described storage apparatus and convert the power into a driving force for the vehicle and a control apparatus configured to perform information processing related to vehicle control on the basis of information about the above-described storage apparatus.

A power system according to an embodiment of the present disclosure includes a power information transmission and receiving unit configured to transmit and receive a signal to and from another apparatus via a network. With information received by the power information transmission and receiving unit, charging control and discharging control are performed on the above-described storage apparatus.

A power system according to an embodiment of the present disclosure receives power from the above-described storage apparatus or supplies power from a generator or a power network to the above-described storage apparatus.

A first monitoring unit and a second monitoring unit are connected between one end and the other end of a series connection including a plurality of battery cells. A current cancellation unit is connected between a connection point between the first and second monitoring units and a middle connection point in the middle of the series connection. Even in a case where a differential current flows from the connection point between the first and second monitoring units to the current cancellation unit, the value of a current flowing from the current cancellation unit to the middle connection point in the middle of the series connection can be zero. Accordingly, it is possible to prevent the differential current from causing the difference in the remaining battery capacity between first and second groups and the loss of the balance between the first and second groups.

Additional features and advantages are described herein, and will be apparent from the following Detailed Description and the figures.

DETAILED DESCRIPTION

Embodiments to be described below are preferred embodiments of the present disclosure and various technically-preferable limitations are given. However, it should be noted that the scope of the present disclosure is not limited to these embodiments unless a description limiting the present disclosure is given in the following description.

[Outline of Storage System]

In a case where many storage elements such as battery cells are used so as to obtain high output power, a structure in which a plurality of storage modules are connected and a common control apparatus is disposed for these storage modules is employed. The structure will be hereinafter referred to as a battery system. A storage module includes a plurality of battery cells such as lithium-ion secondary batteries and a controller.

Figure 2:
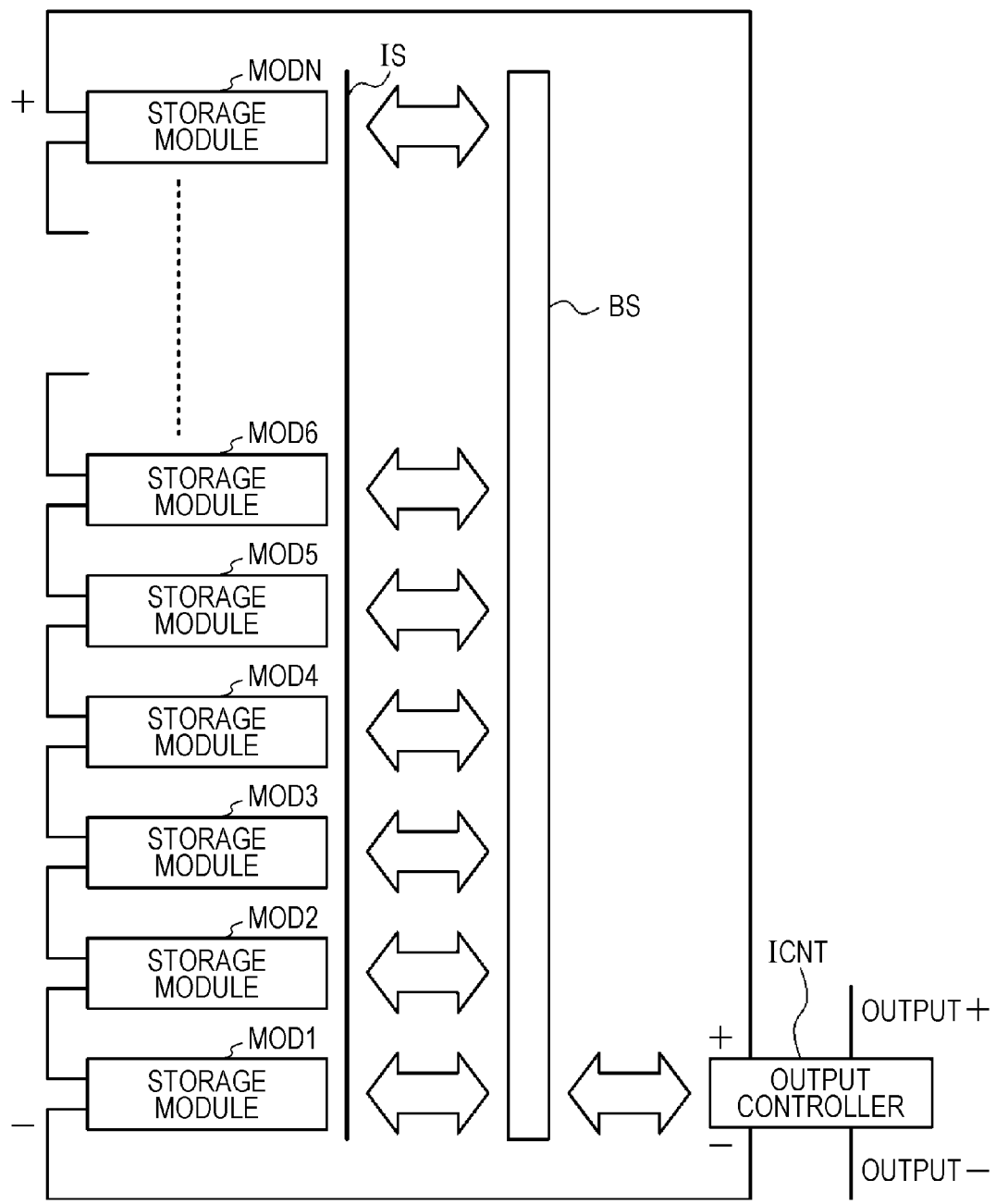
FIG. 2 is a block diagram of an example of a storage system.

As illustrated in FIG. 2, N storage modules MOD1 to MODN are connected in series. The storage modules MOD1 to MODN are connected to an interface bus BS via an insulating portion IS. For each storage module MOD, an insulating interface IF for connecting a module controller CNT and the external interface bus BS is disposed. The insulating interface IF provides insulation between the storage module MOD and the interface bus BS. Each module controller is connected to an integrated controller (hereinafter referred to as an output controller) ICNT. The output controller ICNT performs charge management, discharge management, and management for reduction in deterioration.

A bus in each storage module and the bus BS for connecting the storage modules MOD1 to MODN to the output controller ICNT are serial interfaces. More specifically, as a serial interface, a system management (SM) bus is used. For example, an I2C bus can be used. An I2C bus is used for synchronous serial communication performed with two signal lines, a serial clock (SCL) line and a bi-directional serial data (SDA) line.

The controller CNT for each storage module MOD and the output controller ICNT communicate with each other. That is, the output controller ICNT receives information about the internal state of each storage module and manages charge processing and discharge processing performed on the storage module. The output controller ICNT supplies the output of the series connection of N storage modules to a load. The storage modules can be connected to one another. In a case where the output voltage of each storage module is set to, for example, 80 V and N is in the range of 1 to 5, an output voltage (80 V to 400 V) is generated at the output controller ICNT.

Figure 3:
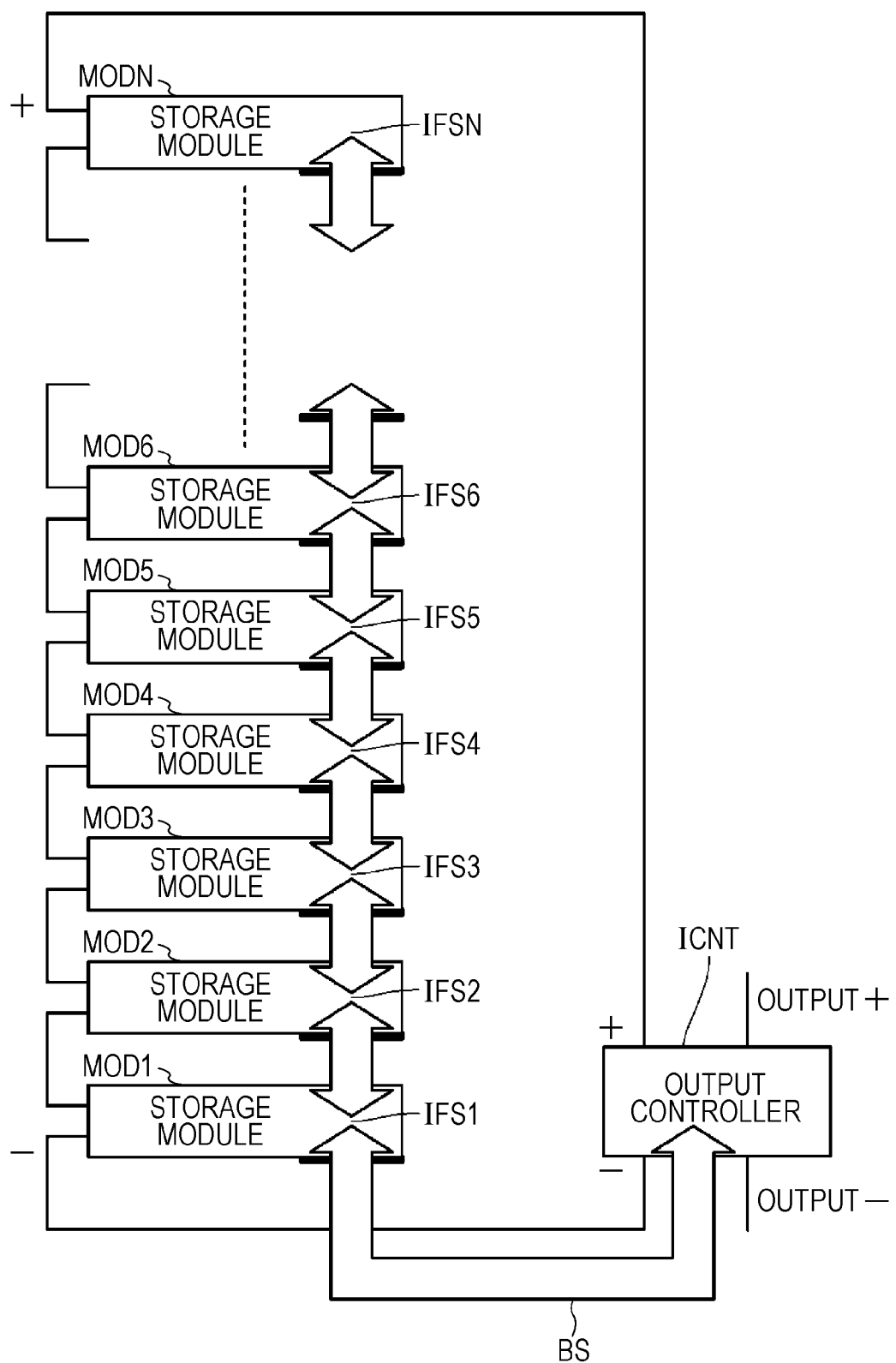
FIG. 3 is a block diagram of another example of a storage system.

FIG. 3 is another example of a storage system. In the other example, the N storage modules MOD1 to MODN are connected in series and each of them includes an insulating interface for providing the insulation between storage modules. A module controller for each storage module communicates with a higher-order storage module, a lower-order storage module, or an external output controller via corresponding one of photocouplers IFS1 to IFSN that are insulating interfaces.

The output controller ICNT is connected to the lowest-order storage module MOD1. The output controller ICNT performs overall control of a battery system. The output controller ICNT receives information about the internal state of each storage module, and supplies and interrupts a charge current and a discharge current for the storage module so as to control the charging and discharging of the storage module.

[Monitor IC]

Figure 4:
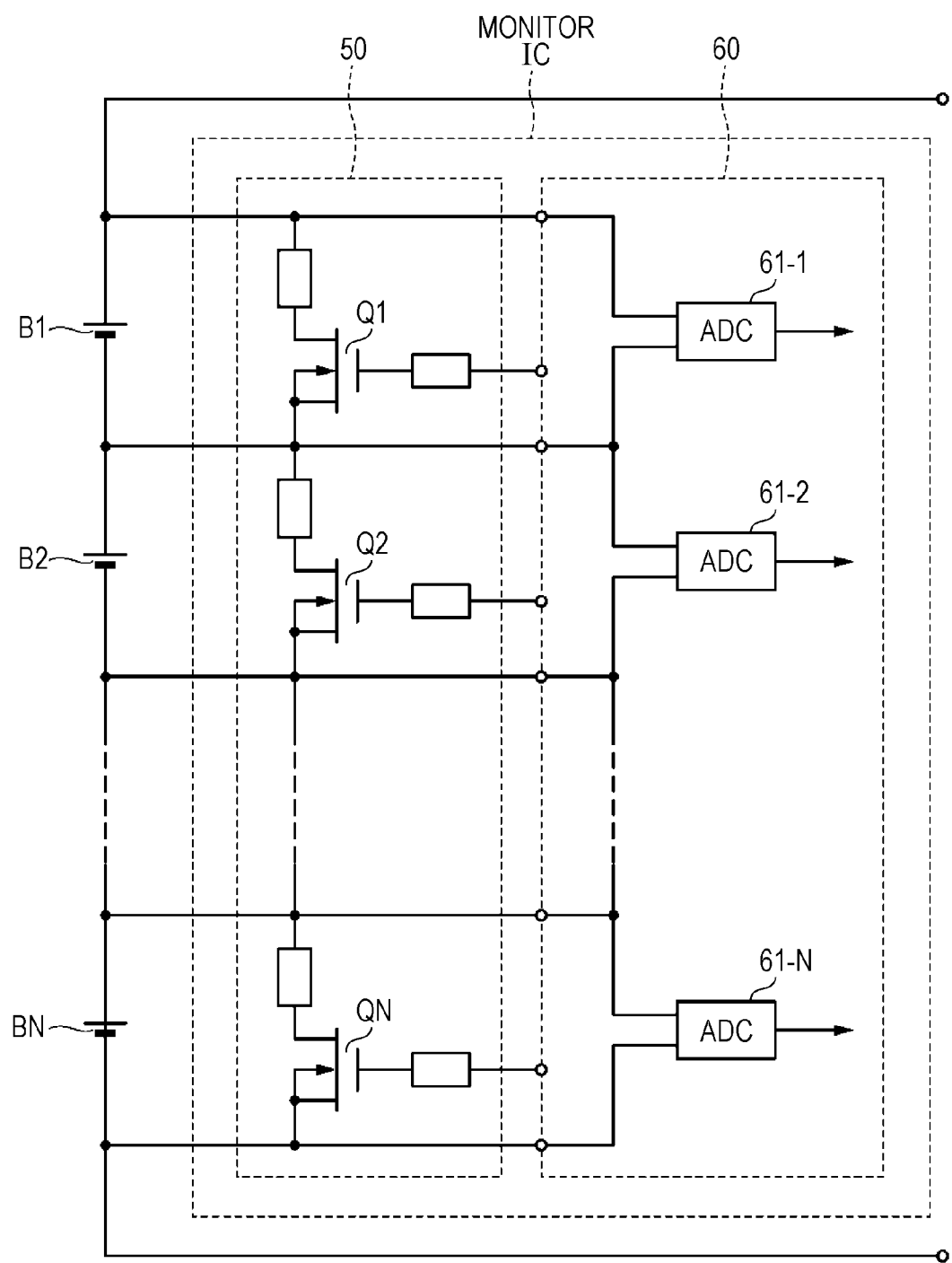
FIG. 4 is a block diagram of an example of a monitor IC.

The present disclosure can be applied to each storage module in the above-described battery system. Each storage module includes a battery monitor circuit that is a detection unit for detecting the voltage of each battery cell and calculating the State Of Charge (SOC) of the battery cell. An example of a monitor IC forming the battery monitor circuit will be described with reference to FIG. 4.

A monitor IC includes a cell balance circuit 50 and a control circuit 60. The cell balance circuit 50 includes switching elements such as Field Effect Transistors (FETs) Q1, Q2, . . . , and QN connected in parallel to battery cells. A switching signal from a control circuit is supplied to the gates of the FETs Q1 to QN. For example, in order to cause a battery cell having a voltage higher than that of the other battery cells to discharge, corresponding one of the FETs Q1 to QN is turned on. The battery cell having a higher voltage discharges via the FET that has been turned on, so that the voltage of the battery cell is reduced.

Another storage module, a charge circuit, or a load is connected to both ends of the series connection (or the parallel connection) of N battery cells B1 to BN. The control circuit 60 includes A/D converters (ADCs in the drawing) 61-1, 61-2, . . . , and 61-N for detecting the voltages of the battery cells B1 to BN and converting the detected voltages into digital signals, respectively. Digital signals output from the A/D converters 61-1 to 61-N are supplied to a control IC (not illustrated). In order to prevent the increase in the number of A/D converters, a multiplexer may sequentially supply the voltages of a plurality of battery cells to an A/D converter.

The control IC included in the control circuit 60 is a microcomputer including, for example, a Central Processing Unit (CPU), and has a structure in which a Read-Only Memory (ROM) and a Random Access Memory (RAM) are connected to the CPU. The control IC performs voltage monitoring and cell balance control by executing a program stored in the ROM. As described previously, the detected voltages (digital values) of the battery cells are transmitted to the higher-order output controller ICNT by communication.

The output controller ICNT is notified that the voltage of each battery cell has reached a set upper limit or a set lower limit and is also notified of the SOC of each battery cell. The output controller ICNT generates a control signal and supplies the control signal to the control circuit 60. The output controller ICNT performs charge management, discharge management, and management for reduction in deterioration.

[Battery Monitor Circuit]

Figure 5:
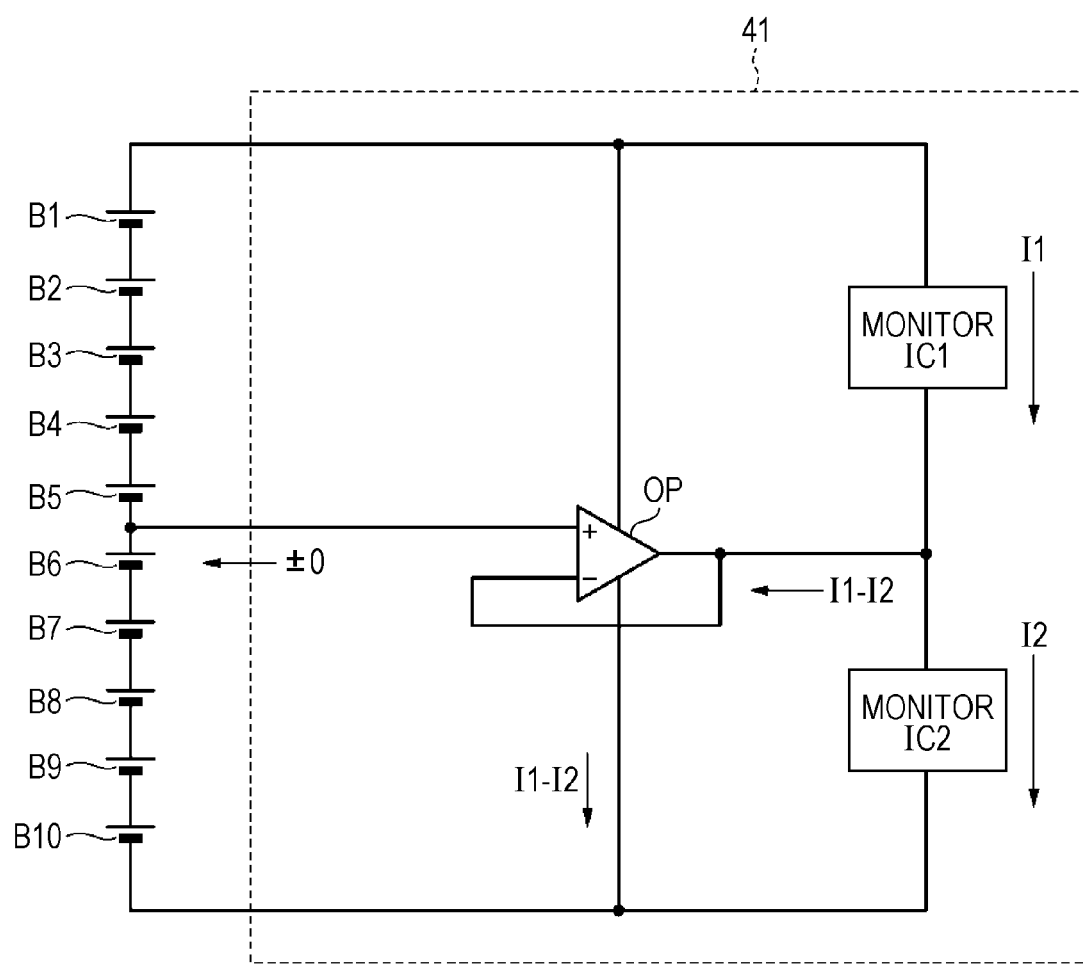
FIG. 5 is a block diagram of a first example of a battery monitor circuit according to an embodiment of the present disclosure.

The maximum number of battery cells that can be detected (monitored) by a single monitor IC is determined Accordingly, a first example of a battery monitor circuit illustrated in FIG. 5, that is, a battery monitor circuit 41, uses the two monitor ICs, the monitor IC1 and the monitor IC2, to detect the voltages of the ten battery cells B1 to B10. The monitor IC1 detects the voltages of the battery cells B1 to B5, and the monitor IC2 detects the voltages of the battery cells B6 to B10.

One end (+ side) of a series connection of the battery cells B1 to B10 is connected to one power terminal (+ side) of the monitor IC1, the other power terminal (− side) of the monitor IC1 is connected to one power terminal (+ side) of the monitor IC2, and the other power terminal (− side) of the monitor IC2 is connected to the other end (− side) of the series connection of the battery cells B1 to B10. Between a point of connection between the other power terminal of the monitor IC1 and one power terminal of the monitor IC2 and a point of connection between the battery cells B5 and B6, a current cancellation unit is disposed.

The current cancellation unit is, for example, an operational amplifier OP. The point of connection between the power terminals of the monitor IC1 and the monitor IC2 is connected to an input terminal (− side) of the operational amplifier OP, and the point of connection between the battery cells B5 and B6 is connected to an input terminal (+ side) of the operational amplifier OP. An output terminal of the operational amplifier OP is connected to the input terminal (− side) of the operational amplifier OP. A resistor may be interposed between the output terminal and the input terminal (− side) of the operational amplifier OP as necessary. A power terminal (+ side) of the operational amplifier OP is connected to a terminal (+ side) of the battery cell B1, and a power terminal (− side) of the operational amplifier OP is connected to a terminal (− side) of the battery cell B10.

In a case where a current I1 flowing from the power terminal (+ side) to the power terminal (− side) of the monitor IC1 and a current I2 flowing from the power terminal (+ side) to the power terminal (− side) of the monitor IC2 are equal, no current flows between the point of connection between the power terminals of the monitor IC1 and the monitor IC2 and the point of connection between the battery cells B5 and B6. However, in a case where they are not equal because of the difference in current consumption between the monitor ICs, a differential current (I1−I2) flows.

Figure 1:
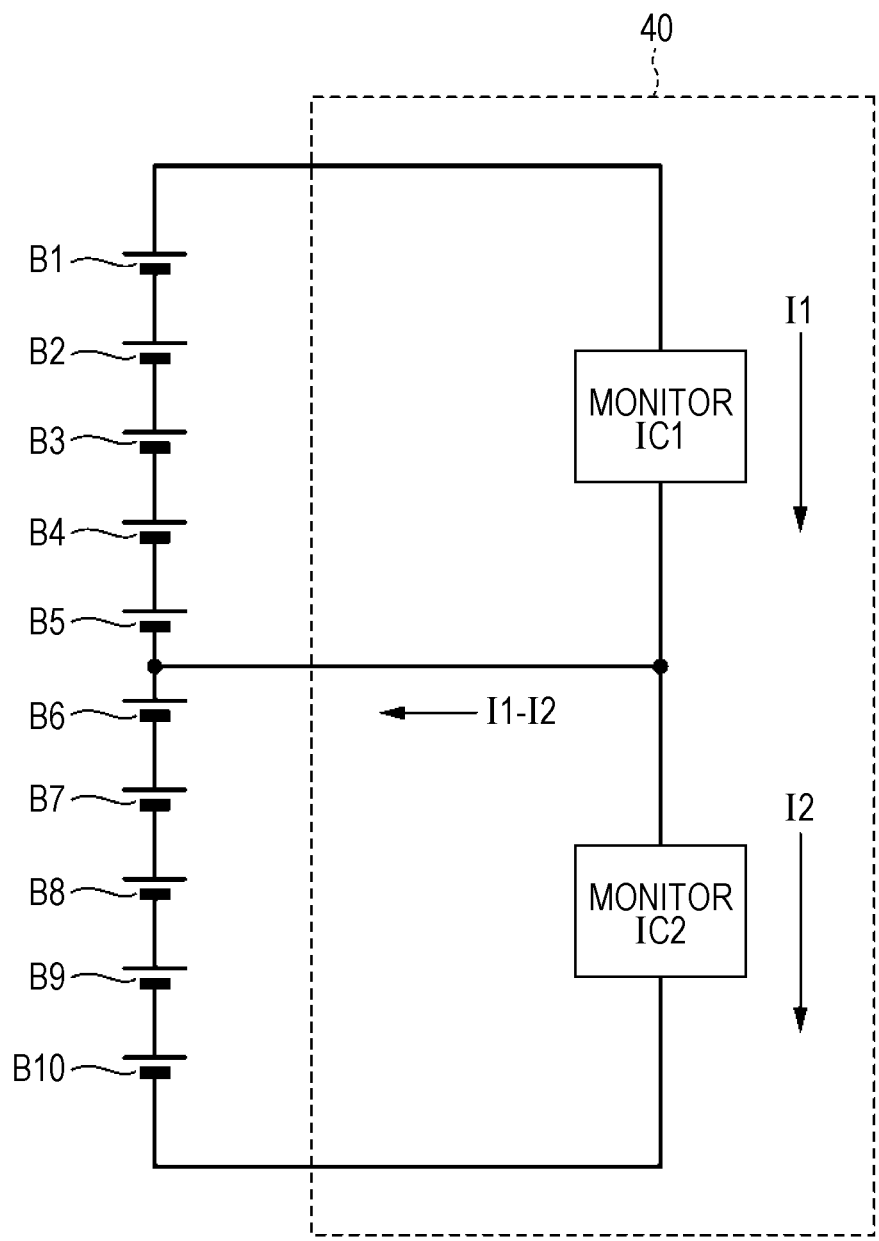
FIG. 1 is a block diagram describing the problem of a monitor circuit.

Since the operational amplifier OP generates an output so that a negative-side input and a positive-side input are equal, no current flows between the input terminal (− side) and the input terminal (+ side) of the operational amplifier OP and the value of the differential current can be zero. An input current (I1−I2) flows between the power terminals of the operational amplifier OP. Since the power terminals of the operational amplifier OP are connected in parallel to the series connection of the battery cells B1 to B10, the current flowing between the power terminals has been supplied from the series connection of the battery cells B1 to B10. That is, the current is a discharge current from the whole of the battery cells B1 to B10. Accordingly, the difference in the remaining battery capacity between battery cells and the loss of the balance between battery cells, which occur in the battery monitor circuit 40 illustrated in FIG. 1 including no current cancellation unit formed of the operational amplifier OP, do not occur.

Figure 6:
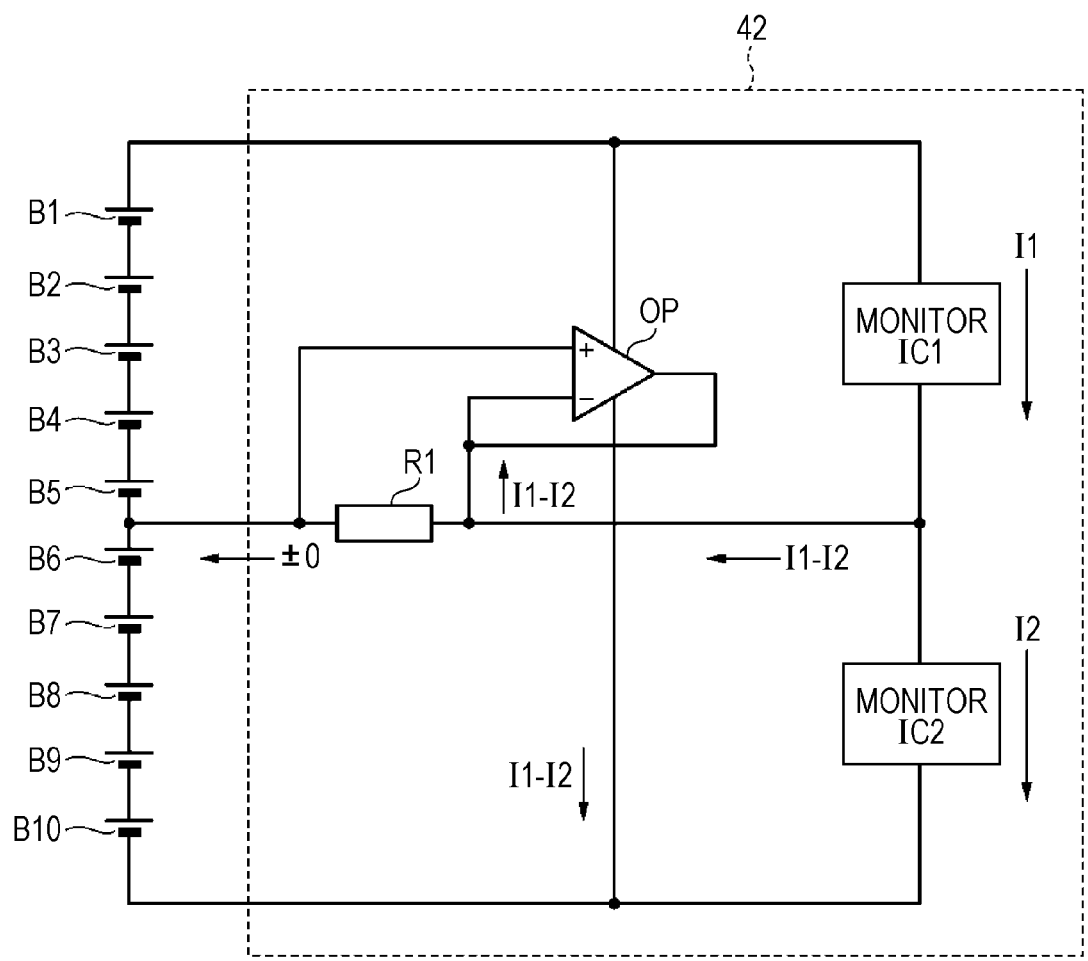
FIG. 6 is a block diagram of a second example of a battery monitor circuit according to an embodiment of the present disclosure.

In a second example of a battery monitor circuit illustrated in FIG. 6, that is, a battery monitor circuit 42, one end (+ side) of the series connection of the battery cells B1 to B10 is connected to one power terminal (+ side) of the monitor IC1, and the other power terminal (− side) of the monitor IC1 is connected to the point of connection between the battery cells B5 and B6 via a resistor R1. One power terminal (+ side) of the monitor IC2 is connected to the point of connection between the battery cells B5 and B6 via the resistor R1, and the other power terminal (− side) of the monitor IC2 is connected to the other end (− side) of the series connection of the battery cells B1 to B10. In order to determine a power supply voltage for the monitor ICs, the point of connection between the battery cells B5 and B6 is connected to the point of connection between the power terminals of the monitor ICs via the resistor R1.

One end of the resistor R1 on the side of the point of connection between the monitor IC1 and the monitor IC2 is connected to the input terminal (− side) of the operational amplifier OP, and the other end of the resistor R1 on the side of the point of connection between the battery cells B5 and B6 is connected to the input terminal (+ side) of the operational amplifier OP. The output terminal of the operational amplifier OP is connected to the input terminal (− side) of the operational amplifier OP. A resistor may be interposed between the output terminal and the input terminal (− side) of the operational amplifier OP as necessary. The power terminal (+ side) of the operational amplifier OP is connected to the terminal (+ side) of the battery cell B1, and the power terminal (− side) of the operational amplifier OP is connected to the terminal (− side) of the battery cell B10.

In a case where the current I1 flowing from the power terminal (+ side) to the power terminal (− side) of the monitor IC1 and the current I2 flowing from the power terminal (+ side) to the power terminal (− side) of the monitor IC2 are equal, no current flows between the point of connection between the power terminals of the monitor IC1 and the monitor IC2 and the point of connection between the battery cells B5 and B6. However, in a case where they are not equal because of the difference in current consumption between the monitor ICs, a differential current (I1−I2) flows via the resistor R1.

Since the operational amplifier OP generates an output so that a negative-side input and a positive-side input are equal, no current flows between the input terminal (− side) and the input terminal (+ side) of the operational amplifier OP via the resistor R1 and the value of the differential current can be zero. An input current (I1−I2) flows between the power terminals of the operational amplifier OP. Since the power terminals of the operational amplifier OP are connected in parallel to the series connection of the battery cells B1 to B10, the current flowing between the power terminals has been supplied from the series connection of the battery cells B1 to B10. That is, the current is a discharge current from the whole of the battery cells B1 to B10. Accordingly, the difference in the remaining battery capacity between battery cells and the loss of the balance between battery cells, which occur in the battery monitor circuit 40 illustrated in FIG. 1 including no current cancellation unit formed of the operational amplifier OP and the resistor R1, do not occur.

Figure 7:
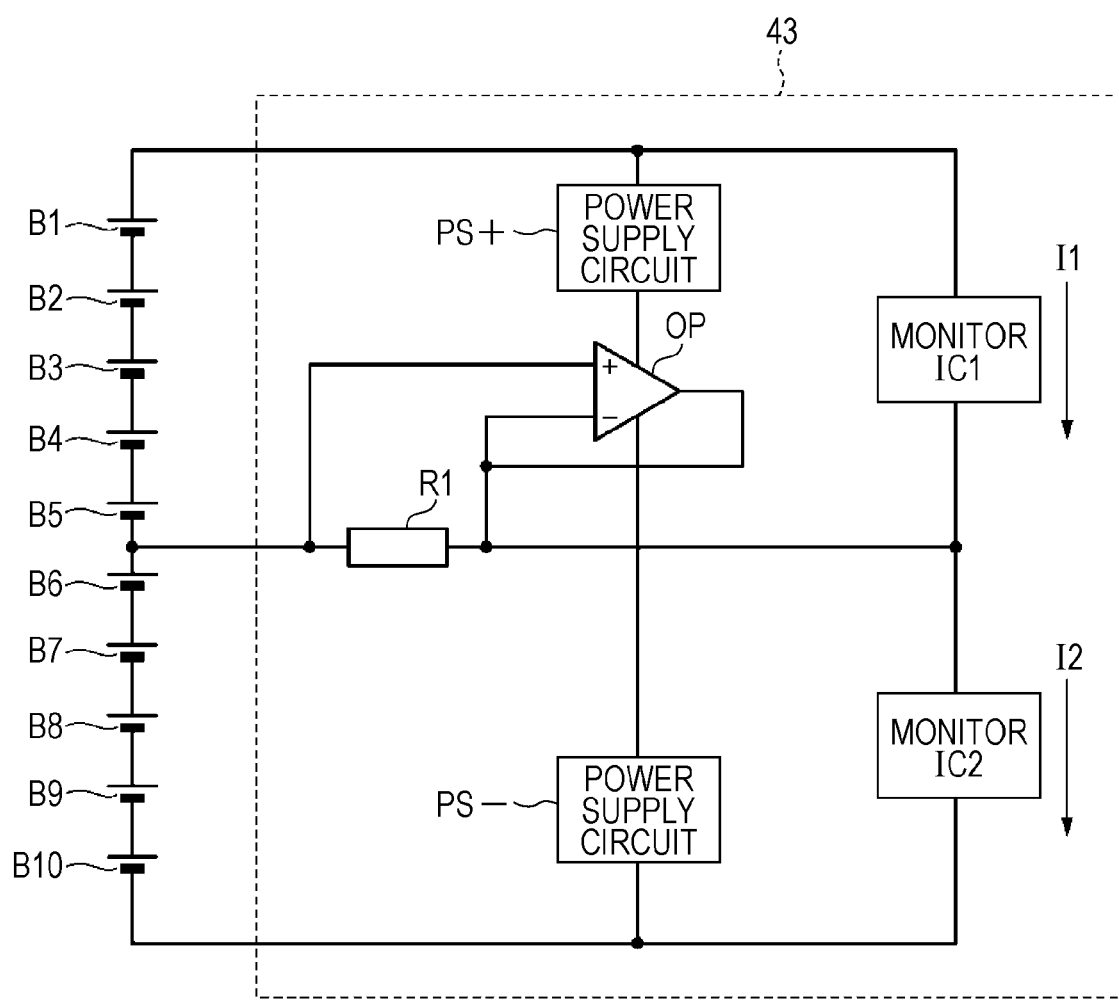
FIG. 7 is a block diagram of a third example of a battery monitor circuit according to an embodiment of the present disclosure.

In a third example of a battery monitor circuit illustrated in FIG. 7, that is, a battery monitor circuit 43, a power supply circuit PS+ is interposed between the power terminal (+ side) of the operational amplifier OP and the terminal (+ side) of the battery cell B1, and a power supply circuit PS− is interposed between the power terminal (− side) of the operational amplifier OP and the terminal (− side) of the battery cell B10. The power supply circuits PS+ and PS− reduce a voltage generated by the battery cells B1 to B10, stabilize the voltage, and generate a power supply voltage for the operational amplifier OP. For example, in a case where the entire voltage of the battery cells B1 to B10 is 50 V (25 V on each side), the power supply circuits PS+ and PS− generate a power supply voltage (+2 V) for the positive side of the operational amplifier OP and a power supply voltage (−2 V) for the negative side of the operational amplifier OP, respectively. In a case where a voltage generated by the battery cells and a power supply voltage for the operational amplifier OP match, the power supply circuits do not have to be disposed like in the first and second examples. In the battery monitor circuit 43 that is the third example, the resistor R1 does not have to be disposed.

Figure 8:
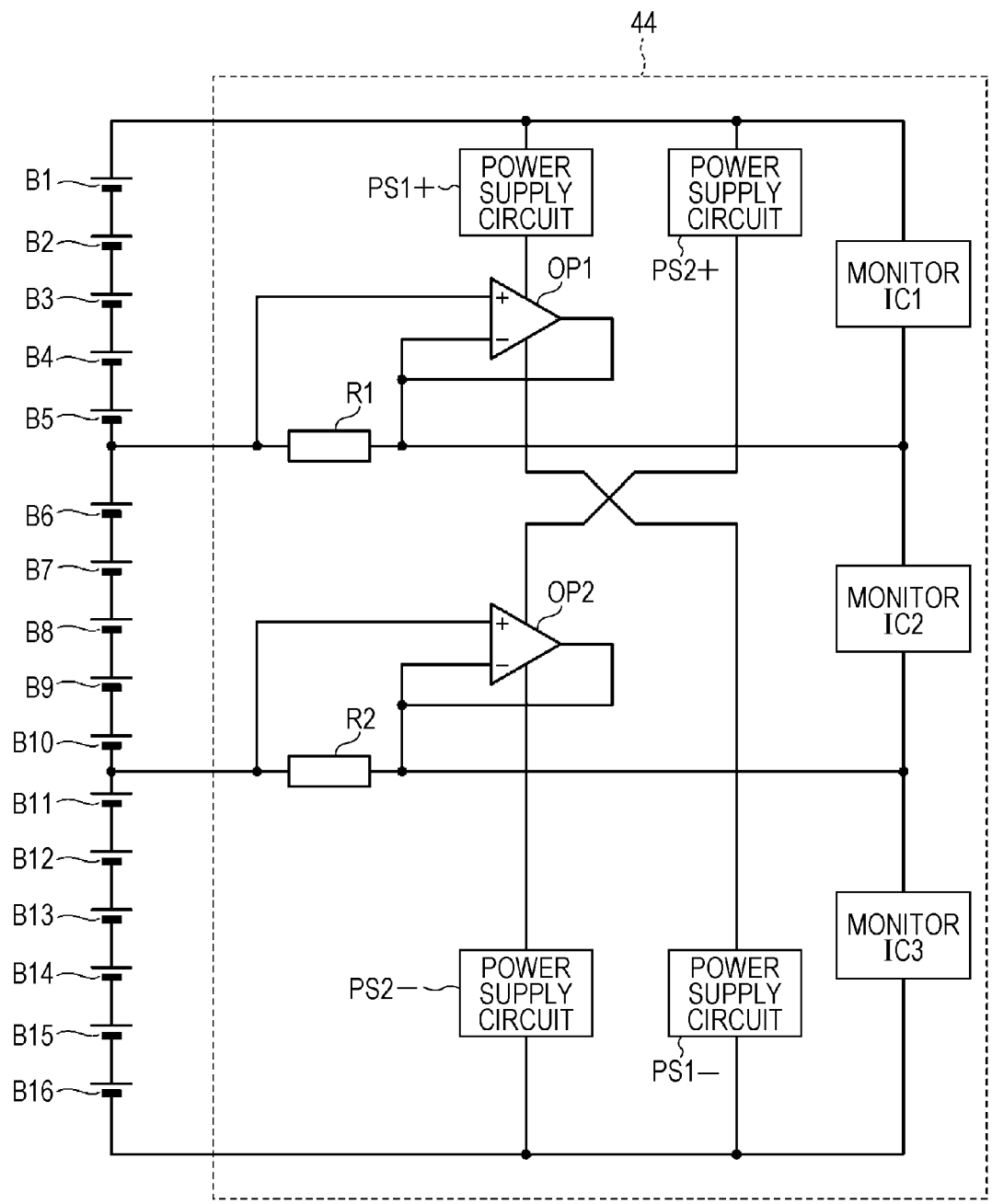
FIG. 8 is a block diagram of a fourth example of a battery monitor circuit according to an embodiment of the present disclosure.

In the present disclosure, more than two monitor ICs may be disposed. In a monitor circuit 44 that is a fourth example illustrated in FIG. 8, the monitor IC1, the monitor IC2, and a monitor IC3 are used. Battery cells B1 to B16 are classified into a first group (the battery cells B1 to B5), a second group (the battery cells B6 to B10), and a third group (the battery cells B11 to B16). The monitor IC1 detects the voltages of five battery cells included in the first group, the monitor IC2 detects the voltages of five battery cells included in the second group, and the monitor IC3 detects the voltages of six battery cells included in the third group.

A point of connection between the power terminal (− side) of the monitor IC1 and the power terminal (+ side) of the monitor IC2 is connected to a point of connection between the battery cells B5 and B6 via the resistor R1. Both ends of the resistor R1 are individually connected to input terminals (− side) and (+ side) of an operational amplifier OP1. An output terminal of the operational amplifier OP1 is connected to the input terminal (− side) of the operational amplifier OP1. A power terminal (+ side) of the operational amplifier OP1 is connected to the terminal (+ side) of the battery cell B1 via a power supply circuit PS1+. A power terminal (− side) of the operational amplifier OP1 is connected to a terminal (− side) of the battery cell B16 via a power supply circuit PS1−. The power supply circuits PS1+ and PS1− reduce a voltage generated by the series connection of the battery cells B1 to B16, stabilize the voltage, and generate a positive power supply voltage to be supplied to the power terminal (+ side) of the operational amplifier OP1 and a negative power supply voltage to be supplied to the power terminal (− side) of the operational amplifier OP 1.

A point of connection between the power terminal (− side) of the monitor IC2 and the power terminal (+ side) of the monitor IC3 is connected to a point of connection between the battery cells B10 and B11 via a resistor R2. Both ends of the resistor R2 are individually connected to input terminals (− side) and (+ side) of an operational amplifier OP2. An output terminal of the operational amplifier OP2 is connected to the input terminal (− side) of the operational amplifier OP2. A power terminal (+ side) of the operational amplifier OP2 is connected to the terminal (+ side) of the battery cell B1 via a power supply circuit PS2+. A power terminal (− side) of the operational amplifier OP2 is connected to the terminal (− side) of the battery cell B16 via a power supply circuit PS2−. The power supply circuits PS2+ and PS2− reduce a voltage generated by the series connection of the battery cells B1 to B16, stabilize the voltage, and generate a positive power supply voltage to be supplied to the power terminal (+ side) of the operational amplifier OP2 and a negative power supply voltage to be supplied to the power terminal (− side) of the operational amplifier OP2.

In the above-described structure, even in a case where the difference (differential current) between the current I1 flowing through the monitor IC1 and the current I2 flowing through the monitor IC2 is not zero, the differential current does not flow through the point of connection between the battery cells B5 and B6. Even in a case where the difference (differential current) between the current I2 flowing through the monitor IC2 and a current I3 flowing through the monitor IC3 is not zero, the differential current does not flow through the point of connection between the battery cells B10 and B11. Accordingly, the difference in the remaining battery capacity among three groups and the loss of the balance among three groups can be prevented from being caused by differential currents. In the monitor circuit 44 that is the fourth example, the resistors R1 and R2 do not have to be disposed.

The present disclosure can realize the following configuration.

(1) A battery monitor circuit including:
a first monitoring unit configured to detect voltages of battery cells included in a first group;
a second monitoring unit configured to detect voltages of battery cells included in a second group; and
a current cancellation unit configured to cancel a differential current that is a difference between a first current flowing through the first monitoring unit and a second current flowing through the second monitoring unit, and
wherein the battery cells included in the first group and the battery cells included in the second group form a series connection,
wherein one terminal of the series connection and one power terminal of the first monitoring unit are connected, the other power terminal of the first monitoring unit and one power terminal of the second monitoring unit are connected, and the other power terminal of the second monitoring unit and the other terminal of the series connection are connected, and
wherein the current cancellation unit is disposed between a connection point between the other power terminal of the first monitoring unit and one power terminal of the second monitoring unit and a middle connection point in the middle of the series connection.

(2) The battery monitor circuit according to (1), wherein the current cancellation unit is an operational amplifier having a negative-side input terminal connected to the connection point, a positive-side input terminal connected to the middle connection point, and an output terminal connected to the negative-side input terminal, and
wherein positive-side power and negative-side power for the operational amplifier are supplied from one terminal and the other terminal of the series connection, respectively.

(3) The battery monitor circuit according to (1), wherein the current cancellation unit is an operational amplifier having a negative-side input terminal connected to the connection point, a positive-side input terminal connected to the middle connection point, and an output terminal connected to the negative-side input terminal, and
wherein one terminal of the series connection is connected to a positive-side power terminal of the operational amplifier via a first power supply circuit, and the other terminal of the series connection is connected to a negative-side power terminal of the operational amplifier via a second power supply circuit.

(4) The battery monitor circuit according to (1), wherein cell balance control is performed so that charging amounts of the battery cells in the series connection are equal to one another.

(5) A storage apparatus including:
a series connection of a plurality of battery cells; and
a battery monitor circuit configured to detect voltages of the plurality of battery cells, and
wherein the plurality of battery cells in the series connection are classified into at least two groups, a first group and a second group,
wherein the battery monitor circuit includes,
a first monitoring unit configured to detect voltages of battery cells included in the first group,
a second monitoring unit configured to detect voltages of battery cells included in the second group, and
a current cancellation unit configured to cancel a differential current that is a difference between a first current flowing through the first monitoring unit and a second current flowing through the second monitoring unit,
wherein one terminal of the series connection and one power terminal of the first monitoring unit are connected, the other power terminal of the first monitoring unit and one power terminal of the second monitoring unit are connected, and the other power terminal of the second monitoring unit and the other terminal of the series connection are connected, and
wherein the current cancellation unit is disposed between a connection point between the other power terminal of the first monitoring unit and one power terminal of the second monitoring unit and a middle connection point in the middle of the series connection.

(6) A storage apparatus including the storage apparatus according to (5), and
wherein power is supplied to an electronic apparatus connected to the storage apparatus.

(7) An electronic apparatus that receives power from the storage apparatus according to (5).

(8) An electric-powered vehicle including:
a conversion apparatus configured to receive power from the storage apparatus according to (5) and convert the power into a driving force for the vehicle; and
a control apparatus configured to perform information processing related to vehicle control on the basis of information about the storage apparatus.

(9) A power system including a power information transmission and receiving unit configured to transmit and receive a signal to and from another apparatus via a network, and
wherein, with information received by the power information transmission and receiving unit, charging control and discharging control are performed on the storage apparatus according to (5).

(10) A power system that receives power from the storage apparatus according to (5) or supplies power from a generator or a power network to the storage apparatus.

[Home Storage System as Application Example]

Figure 9:
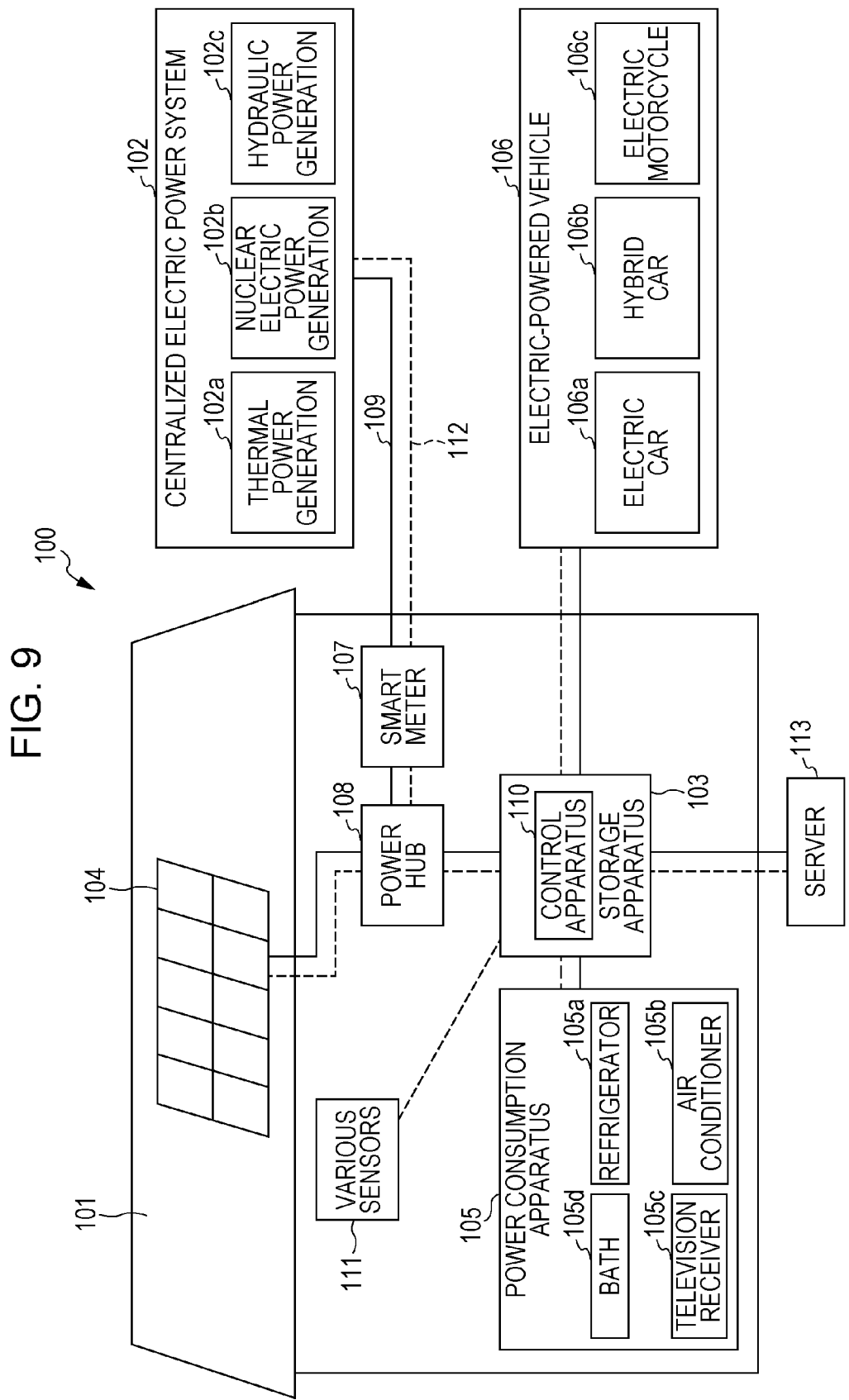
FIG. 9 is a block diagram describing an example of application of a storage system.

An example of application of the present disclosure to a home storage system will be described with reference to FIG. 9. For example, in a storage system 100 for a house 101, power is supplied from a centralized electric power system 102 for performing thermal power generation 102a, nuclear electric power generation 102b, and hydraulic power generation 102c to a storage apparatus 103 via a power network 109, an information network 112, a smart meter 107, and a power hub 108. In addition, power is supplied from a home power generation apparatus 104 that is an independent power source to the storage apparatus 103. The storage apparatus 103 stores supplied power and supplies power to be used in the house 101. Not only in the house 101 but also in a building, a similar storage system can be used.

In the house 101, the power generation apparatus 104, power consumption apparatuses 105, the storage apparatus 103, a control apparatus 110 for controlling each apparatus, the smart meter 107, and sensors 111 for acquiring various pieces of information are disposed. These apparatuses are connected to one another via the power network 109 and the information network 112. As the power generation apparatus 104, a solar battery or a fuel cell is used. Power generated by the power generation apparatus 104 is supplied to the power consumption apparatuses 105 and/or the storage apparatus 103. The power consumption apparatuses 105 include, for example, a refrigerator 105a, an air conditioner 105b, a television receiver 105c, and a bath 105d. The power consumption apparatuses 105 further include electric-powered vehicles 106. The electric-powered vehicles 106 include an electric car 106a, a hybrid car 106b, and an electric motorcycle 106c.

The above-described storage system according to an embodiment of the present disclosure is applied to the storage apparatus 103. The storage apparatus 103 includes a secondary battery or a capacitor. For example, the storage apparatus 103 includes a lithium-ion battery. The lithium-ion battery may be a stationary lithium-ion battery or may be used in the electric-powered vehicles 106. The smart meter 107 has a function of measuring commercial electric power usage and notifying a power company of the measured commercial electric power usage. The power network 109 may employ one of DC feeding, AC feeding, and noncontact feeding or employ them in combination.

The various sensors 111 include, for example, a human detection sensor, an illumination detection sensor, an object detection sensor, an electric power usage sensor, a vibration sensor, a contact sensor, a temperature sensor, and an infrared sensor. Pieces of information acquired by the various sensors 111 are transmitted to the control apparatus 110. The control apparatus 110 determines weather conditions and human conditions on the basis of pieces of information from the sensors 111 and automatically controls the power consumption apparatuses 105. As a result, energy consumption can be minimized Furthermore, the control apparatus 110 can externally transmit information about the house 101 to a power company via the Internet.

The power hub 108 performs processing for allowing a power line to branch off and processing for converting a direct current into an alternating current. As a communication method of the information network 112 connected to the control apparatus 110, a method using a communication interface such as a Universal Asynchronous Receiver-Transceiver (UART) or a method using a sensor network compliant with a radio communication standard such as Bluetooth, ZigBee, or Wi-Fi is employed. Bluetooth is used for multimedia communication and realizes communication over multipoint connections. ZigBee uses a physical layer in Institute of Electrical and Electronics Engineers (IEEE) 802.15.4. IEEE 802.15.4 is a name of a near field communication standard called Personal Area Network (PAN) or Wireless (W) PAN.

The control apparatus 110 is connected to an external server 113. The server 113 may be managed by one of the house 101, a power company, and a service provider. Pieces of information received by or transmitted from the server 113 include, for example, power usage information, life pattern information, information about electric power rates, weather information, natural disaster information, and electric power trading information. These pieces of information may be transmitted from or received by a power consumption apparatus (for example a television receiver) in the house or an apparatus (for example a mobile telephone) outside the house. These pieces of information may be displayed on an apparatus having a display function, for example, a television receiver, a mobile telephone, or a Personal Digital Assistant (PDA).

The control apparatus 110 for controlling each unit is formed of a Central Processing Unit (CPU), a Random Access Memory (RAM), and a Read-Only Memory (ROM), and is included in the storage apparatus 103 in this example. The control apparatus 110 is connected to the storage apparatus 103, the home power generation apparatus 104, the power consumption apparatuses 105, the various sensors 111, and the server 113 via the information network 112. The control apparatus 110 has, for example, a function of controlling commercial electric power usage and the amount of power generation, and may have a function of performing electric power trading in an electric power market.

As described above, not only power generated by the centralized electric power system 102 for performing the thermal power generation 102a, the nuclear electric power generation 102b, and the hydraulic power generation 102c but also power generated by the home power generation apparatus 104 for performing solar-electric power generation and wind power generation can be stored in the storage apparatus 103. Accordingly, irrespective of the amount of power generated by the home power generation apparatus 104, control processing for stabilizing the amount of power to be externally transmitted or control processing for setting the necessary amount of discharge can be performed. For example, power obtained by solar-electric power generation and low-priced midnight electric power can be stored in the storage apparatus 103, and the power stored in the storage apparatus 103 can be used during the daytime in which high electric power rates are set.

In this example, the control apparatus 110 is included in the storage apparatus 103. However, the control apparatus 110 may be included in the smart meter 107 or does not have to be included in an apparatus. The storage system 100 may be used for a plurality of families in an apartment house or a plurality of detached houses.

[Intra-vehicle Storage System as Application Example]

Figure 10:
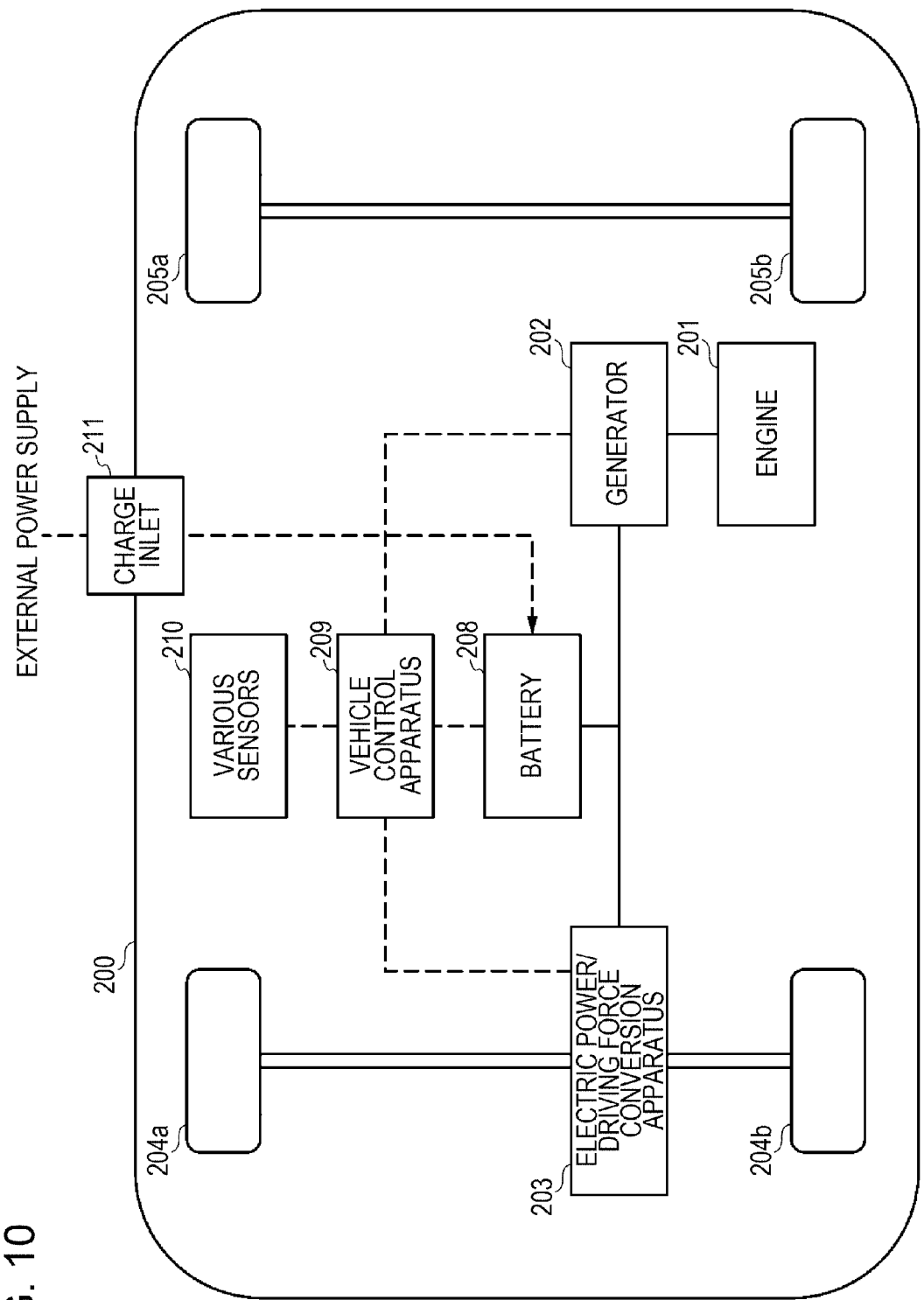
FIG. 10 is a block diagram describing an example of application of a storage system.

An example of application of the present disclosure to an intra-vehicle storage system will be described with reference to FIG. 10. FIG. 10 is a schematic diagram illustrating an example of a structure of a hybrid vehicle employing a series hybrid system according to an embodiment of the present disclosure. A vehicle employing a series hybrid system is a vehicle that is moved by an electric power/driving force conversion apparatus with power generated by a generator driven by an engine or power that has been generated by the generator and has been temporarily stored in a battery.

A hybrid vehicle 200 includes an engine 201, a generator 202, an electric power/driving force conversion apparatus 203, a driving wheel 204a, a driving wheel 204b, a wheel 205a, a wheel 205b, a battery 208, a vehicle control apparatus 209, various sensors 210, and a charge inlet 211. A storage system according to an embodiment of the present disclosure is applied to the battery 208.

The hybrid vehicle 200 moves with power from the electric power/driving force conversion apparatus 203. The electric power/driving force conversion apparatus 203 is, for example, a monitor. The electric power/driving force conversion apparatus 203 is operated with power from the battery 208, and the rotational force of the electric power/driving force conversion apparatus 203 is transmitted to the driving wheels 204a and 204b. As the electric power/driving force conversion apparatus 203, an AC motor and a DC motor can be used by disposing a DC-AC converter or an AC-DC converter at a necessary position. The sensors 210 control the number of revolutions of an engine via the vehicle control apparatus 209 and control the degree of opening of a throttle valve (not illustrated). The sensors 210 include a speed sensor, an acceleration sensor, and a sensor for detecting the number of revolutions of an engine.

The rotational force of the engine 201 is transmitted to the generator 202. With the rotational force, the generator 202 generates power. The power can be stored in the battery 208.

When the speed of a hybrid vehicle is reduced by a brake mechanism (not illustrated), a resistance at the time of the reduction in the speed of the hybrid vehicle is transmitted to the electric power/driving force conversion apparatus 203 as a rotational force. The electric power/driving force conversion apparatus 203 generates regenerative electric power with the rotational force and stores the generated regenerative electric power in the battery 208.

The battery 208 can be connected to an external power supply outside the hybrid vehicle, receive power from the external power supply via the charge inlet 211, and store the received power.

Although not illustrated, an information processing apparatus for performing information processing related to vehicle control on the basis of information about a secondary battery may be disposed. The information processing apparatus is, for example, an information processing apparatus for displaying the amount of remaining battery power on the basis of information about the amount of remaining battery power.

A series hybrid car that is moved by a motor with power generated by a generator driven by an engine or power that has been generated by the generator and temporarily stored in a battery has been described. However, the present disclosure can be effectively applied to a parallel hybrid car that uses both outputs of an engine and a motor as a driving force and switches among three driving methods, driving with only an engine, driving with only a motor, and driving with both an engine and a motor. In addition, the present disclosure can be effectively applied to an electric-powered vehicle that is moved not by an engine but by only a driving motor.

[Modification]

Embodiments of the present disclosure have been described in detail. However, the present disclosure is not limited to the embodiments, and various changes can be made on the basis of the spirit and scope of the present disclosure. For example, as the above-described battery cell, a secondary battery other than a lithium-ion secondary battery may be used. Furthermore, the structures, methods, processes, shapes, materials, numerical values, and the like described in the above-described embodiments have been described by way of example, and structures, methods, processes, shapes, materials, numerical values, and the like different from those described above may be used as appropriate.

Furthermore, the structures, methods, processes, shapes, materials, numerical values, and the like described in the above-described embodiments can be used in combination without departing from the scope of the present disclosure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A battery monitor circuit comprising:
a first monitoring unit configured to detect voltages of battery cells included in a first group;
a second monitoring unit configured to detect voltages of battery cells included in a second group; and
a current cancellation unit configured to cancel a differential current that is a difference between a first current flowing through the first monitoring unit and a second current flowing through the second monitoring unit,
wherein the battery cells included in the first group and the battery cells included in the second group form a series connection, and
wherein one terminal of the first group of battery cells and one power terminal of the first monitoring unit are connected, the other power terminal of the first monitoring unit and one power terminal of the second monitoring unit are connected, and the other power terminal of the second monitoring unit and one terminal of the second group of battery cells are connected.

2. The battery monitor circuit according to claim 1, wherein the current cancellation unit is an operational amplifier having a negative-side input terminal connected to a connection point between a power terminal of the first monitoring unit and a power terminal of the second monitoring unit, a positive-side input terminal connected to a middle connection point between two battery cells of the series connection, and an output terminal connected to the negative-side input terminal, and wherein positive-side power and negative-side power for the operational amplifier are supplied from at least one of the first group of battery cells and the second group of battery cells.

3. The battery monitor circuit according to claim 1, wherein the current cancellation unit is an operational amplifier having a negative-side input terminal connected to a connection point between a power terminal of the first monitoring unit and a power terminal of the second monitoring unit, a positive-side input terminal connected to a middle connection point between two battery cells of the series connection, and an output terminal connected to the negative-side input terminal, and wherein one terminal of the series connection is connected to a positive-side power terminal of the operational amplifier via a first power supply circuit, and another terminal of the series connection is connected to a negative-side power terminal of the operational amplifier via a second power supply circuit.

4. The battery monitor circuit according to claim 1, wherein cell balance control is performed so that charging amounts of the battery cells in the series connection are equal to one another.

5. A storage apparatus comprising:
a plurality of battery cells; and
a battery monitor circuit configured to detect voltages of the plurality of battery cells,
wherein the plurality of battery cells are classified into at least two groups, a first group and a second group, and
wherein the battery monitor circuit includes,
a first monitoring unit configured to detect voltages of battery cells included in the first group,
a second monitoring unit configured to detect voltages of battery cells included in the second group, and
a current cancellation unit configured to cancel a differential current that is a difference between a first current flowing through the first monitoring unit and a second current flowing through the second monitoring unit,
wherein the battery cells included in the first group and the battery cells included in the second group form a series connection, and
wherein one terminal of the first group of battery cells and one power terminal of the first monitoring unit are connected, the other power terminal of the first monitoring unit and one power terminal of the second monitoring unit are connected, and the other power terminal of the second monitoring unit and one terminal of the second group of battery cells are connected.

6. An apparatus comprising the storage apparatus according to claim 5,
wherein power is supplied to an electronic apparatus connected to the storage apparatus.

7. An electronic apparatus that receives power from the storage apparatus according to claim 5.

8. An electric-powered vehicle comprising:
a conversion apparatus configured to receive power from the storage apparatus according to claim 5 and convert the power into a driving force for the electric-powered vehicle; and
a control apparatus configured to perform information processing related to vehicle control on the basis of information about the storage apparatus.

9. A power system comprising a power information transmission and receiving unit configured to transmit and receive a signal to and from another apparatus via a network, and
wherein, with information received by the power information transmission and receiving unit, charging control and discharging control are performed on the storage apparatus according to claim 5.

10. A power system that receives power from the storage apparatus according to claim 5 or supplies power from a generator or a power network to the storage apparatus.

11. The battery monitor circuit according to claim 1, wherein the current cancellation unit is disposed between a connection point between the other power terminal of the first monitoring unit and the one power terminal of the second monitoring unit and a middle connection point between two battery cells of the first and second groups.

12. The battery monitor circuit according to claim 1, wherein the current cancellation unit is disposed between a first connection point between the first monitoring unit and the second monitoring unit and a second connection point between two battery cells of the first and second groups.

13. The battery monitor circuit according to claim 1, wherein the current cancellation unit includes an operational amplifier connected to a connection point between two battery cells of the series connection.

14. The storage apparatus of claim 5, wherein the current cancellation unit is disposed between a connection point between the other power terminal of the first monitoring unit and the one power terminal of the second monitoring unit and a middle connection point between two battery cells of the plurality of battery cells.

15. The storage apparatus of claim 5, wherein the current cancellation unit is disposed between a first connection point between the first monitoring unit and the second monitoring unit and a second connection point between two battery cells of the plurality of battery cells.

16. The storage apparatus of claim 5, wherein the current cancellation unit includes an operational amplifier connected to a connection point between two battery cells of the plurality of battery cells.

* * * * *